US009281180B2

(12) United States Patent
Koukitu et al.

(10) Patent No.: US 9,281,180 B2
(45) Date of Patent: Mar. 8, 2016

(54) METHOD FOR PRODUCING GALLIUM TRICHLORIDE GAS AND METHOD FOR PRODUCING NITRIDE SEMICONDUCTOR CRYSTAL

(75) Inventors: Akinori Koukitu, Tokyo (JP); Yoshinao Kumagai, Tokyo (JP)

(73) Assignee: National University Corporation Tokyo University of Agriculture, Tokyo (JP)

(*) Notice: Subject to any disclaimer, the term of this patent is extended or adjusted under 35 U.S.C. 154(b) by 0 days.

(21) Appl. No.: 13/697,218

(22) PCT Filed: May 11, 2011

(86) PCT No.: PCT/JP2011/060892
§ 371 (c)(1),
(2), (4) Date: Feb. 4, 2013

(87) PCT Pub. No.: WO2011/142402
PCT Pub. Date: Nov. 17, 2011

(65) Prior Publication Data

US 2013/0130477 A1 May 23, 2013

(30) Foreign Application Priority Data

May 12, 2010 (JP) ................................ 2010-110064

(51) Int. Cl.
*C23C 16/455* (2006.01)
*H01L 21/20* (2006.01)
*H01L 21/02* (2006.01)
(Continued)

(52) U.S. Cl.
CPC ........ *H01L 21/02107* (2013.01); *C23C 16/303* (2013.01); *C23C 16/4488* (2013.01); *C30B 25/00* (2013.01); *C30B 25/14* (2013.01); *C30B 29/403* (2013.01); *C30B 35/007* (2013.01); *H01L 21/0237* (2013.01);
(Continued)

(58) Field of Classification Search
CPC .................................................... H01L 21/205
USPC .............................. 117/84; 438/478; 423/495
See application file for complete search history.

(56) References Cited

U.S. PATENT DOCUMENTS 4,144,116 A * 3/1979 Jacob et al. ..................... 117/91
4,956,159 A * 9/1990 Shibasaki et al. ............. 423/135
(Continued)

FOREIGN PATENT DOCUMENTS

JP 11-354844 A 12/1999
JP 2006-14351 A 1/2006
(Continued)

OTHER PUBLICATIONS

Lai, Ying-Huang “Sputtering and Etching of GaN Surfaces” J. Phys. Chem. B 2001, 105 10029-10036.*
(Continued)

*Primary Examiner* — Matthew Landau
*Assistant Examiner* — Eric Ashbahian
(74) *Attorney, Agent, or Firm* — Kilpatrick Townsend & Stockton LLP

(57) ABSTRACT

According to the invention, there is provided a method for producing a gallium trichloride gas, the method including: a first step of reacting a metallic gallium and a chlorine gas to produce a gallium monochloride gas; and a second step of reacting the produced gallium monochloride gas and a chlorine gas to produce a gallium trichloride gas.

12 Claims, 10 Drawing Sheets

(51) Int. Cl.

| | |
|---|---|
| ***C23C 16/30*** | (2006.01) |
| ***C23C 16/448*** | (2006.01) |
| ***C30B 25/00*** | (2006.01) |
| ***C30B 29/40*** | (2006.01) |
| ***C30B 35/00*** | (2006.01) |
| ***C30B 25/14*** | (2006.01) |
| *C01G 15/00* | (2006.01) |

(52) U.S. Cl.
CPC ....... *H01L 21/0254* (2013.01); *H01L 21/0262* (2013.01); *C01G 15/00* (2013.01)

(56) References Cited

U.S. PATENT DOCUMENTS

| | | | | |
|---|---|---|---|---|
| 6,270,587 | B1 * | 8/2001 | Motoki et al. | 148/33.4 |
| 2009/0056631 | A1 * | 3/2009 | Lai | 118/733 |
| 2009/0149008 | A1 * | 6/2009 | Kryliouk et al. | 438/503 |
| 2010/0093124 | A1 * | 4/2010 | Koukitu et al. | 438/46 |
| 2010/0215854 | A1 * | 8/2010 | Burrows | C23C 16/4488 427/255.39 |
| 2011/0155049 | A1 * | 6/2011 | Solomon et al. | 117/99 |

FOREIGN PATENT DOCUMENTS

| | | | |
|---|---|---|---|
| JP | 2006-96588 | A | 4/2006 |
| WO | 2009/046261 | A1 | 4/2009 |

OTHER PUBLICATIONS

Hanaoka et al. Thermodynamic analysis on HVPE growth of InGaN ternary alloy. Journal of Crystal Growth 318, 441-445 (2011).*

Kikuchi et al. Thermodynamic Analysis of Various Types of Hydride Vapor Phase Epitaxy System for High-Speed Growth of InN. Japanese Journal of Applied Physics vol. 45, No. 45 L1203-1205 (2006).*

Varadarajan et al.; "Growth of GaN films by chloride vapour phase epitaxy"; *Journal of Crystal Growth*; 268:475-477 (2004).

The International Search Report from PCT/US2011/060892, dated Jun. 14, 2011 (2 pages; Japanese Language).

The International Search Report from PCT/JP2011/060892, dated Jun. 14, 2011 (2 pages; Japanese Language).

Extended European Search Report issued on Feb. 21, 2014 for EP Application No. 11780659.6, 6 pages.

* cited by examiner

METHOD FOR PRODUCING GALLIUM TRICHLORIDE GAS AND METHOD FOR PRODUCING NITRIDE SEMICONDUCTOR CRYSTAL

CROSS-REFERENCE TO RELATED APPLICATIONS

This application is the U.S. National Stage entry of International Application No. PCT/JP2011/060892, filed May 11, 2011, which claims priority to Japanese Patent Application No. 2010-110064, filed May 12, 2010, the contents of each are herein incorporated by reference.

TECHNICAL FIELD

The invention relates to a method for producing a gallium trichloride gas and a method for producing a nitride semiconductor crystal.

BACKGROUND ART

Mass production of free-standing gallium nitride crystals (free-standing substrates of gallium nitride crystals) using a hydride vapor phase epitaxy (HVPE) method has begun in around 2003. Owing to the mass production of free-standing gallium nitride crystals, BluRay has been put into practical use.

Conventionally, a gallium monochloride-ammonia system (GaCl—$NH_3$ system) has been used as a reaction system in HVPE gallium nitride (GaN) crystal growth.

For example, WO 2008/038632 discloses that a GaN crystal is produced by the reaction of GaCl and $NH_3$. Further, Japanese Patent Application Laid-Open (JP-A) No. 2006-14351 discloses producing GaN excessively doped with Si by the reaction of GaCl and $NH_3$ in the presence of $SiH_2Cl_2$. Further, JP-A No. 11-354844 discloses a method of producing GaN by the reaction of $NH_3$ and GaCl produced by the reaction of Ga and $GaCl_3$.

Further, Journal of Crystal Growth 268 (2004) p. 475-477 ("Growth of GaN films by chloride vapour phase epitaxy", E. Varadarajan et. al) reports growth of GaN using $GaCl_3$ as a raw material.

SUMMARY OF INVENTION

Technical Problem

In the above-described crystal growth by a GaCl—$NH_3$ system, GaCl is produced by, for example, introducing hydrogen chloride (HCl) onto heated metallic Ga of 7N grade (purity 99.99999%) to react Ga and HCl. Although it varies depending on the reaction conditions such as a HCl concentration, in the reaction of Ga and HCl in a usual HCl concentration of about $10^{-2}$ atm, gallium monochloride (GaCl) is mainly generated at a temperature of 500° C. or more but the concentration of gallium trichloride ($GaCl_3$) increases with decrease of temperature at a temperature of less than 500° C.

Gallium trichloride ($GaCl_3$) is thus obtained by the method of reacting Ga and HCl at a low temperature of less than 500° C., but only a mixture containing a substantial amount of GaCl in addition to $GaCl_3$ is obtained in this method. Accordingly, the method of reacting Ga and HCl at a low temperature of less than 500° C. to obtain $GaCl_3$ is poor in $GaCl_3$ selectivity. Further, in the method of reacting Ga and HCl at a low temperature of less than 500° C., since the reaction rate decreases with decrease of the reaction temperature, there is a high possibility that the reaction does not proceed completely and unreacted HCl is sent downstream to result in unstable crystal growth.

For that reason, the method of reacting Ga and HCl is unsuitable for mass production of gallium trichloride ($GaCl_3$). Also, mainly for that reason, gallium monochloride (GaCl), which is obtained at a high temperature and a high reaction rate in the raw material section, is used rather than gallium trichloride ($GaCl_3$) as a raw material for conventional HVPE growth of GaN crystals.

On the other hand, it is possible to grow a crystal at a higher rate and at a higher temperature by using, as the reaction system for crystal growth, a gallium trichloride-ammonia system ($GaCl_3$—$NH_3$ system) in place of a gallium monochloride-ammonia system (GaCl—$NH_3$ system). This is because the $GaCl_3$—$NH_3$ system provides a large free energy change during crystal growth compared to the GaCl—$NH_3$ system, and as a result, a large driving force for growth is obtained.

The above-described JP-A No. 11-354844 and Journal of Crystal Growth 268 (2004) p. 475-477 disclose the use of $GaCl_3$ but fail to specifically disclose a production method of $GaCl_3$.

Usually, gaseous $GaCl_3$ is obtained as vapor of solid $GaCl_3$. However, in the method of obtaining gaseous $GaCl_3$ as vapor of solid $GaCl_3$, there is a problem that the gaseous $GaCl_3$ has too low purity for the use as a raw material for a compound semiconductor because the solid $GaCl_3$ is very hygroscopic.

The invention has been made in view of the above.

That is, it is an object of the invention to provide a method for producing a gallium trichloride gas which may produce a high-purity gallium trichloride gas with good selectivity.

It is another object of the invention to provide a method for producing a nitride semiconductor crystal which may grow a nitride semiconductor crystal including gallium at a high growth temperature and a high growth rate.

Solution to Problem

Specific means for solving the problem is as follows.

<1> A method for producing a gallium trichloride gas, the method including: a first step of reacting a metallic gallium and a chlorine gas to produce a gallium monochloride gas; and a second step of reacting the produced gallium monochloride gas and a chlorine gas to produce a gallium trichloride gas.

<2> The method for producing a gallium trichloride gas according to <1>, wherein in the first step, the reaction of the metallic gallium and the chlorine gas is carried out at a temperature of from 300 to 1,000° C.

<3> The method for producing a gallium trichloride gas according to <1> or <2>, wherein in the second step, the reaction of the gallium monochloride gas and the chlorine gas is carried out at a temperature of from 150 to 1,000° C.

<4> The method for producing a gallium trichloride gas according to any one of <1> to <3>, wherein in the first step, the reaction of the metallic gallium and the chlorine gas is carried out at a temperature of from 500 to 1,000° C.

<5> The method for producing a gallium trichloride gas according to any one of <1> to <4>, wherein in the second step, the reaction of the gallium monochloride gas and the chlorine gas is carried out at a temperature of from 500 to 1,000° C.

<6> The method for producing gallium trichloride gas according to any one of <1> to <5>, wherein each of the reactions in the first step and the second step is carried out in the presence of a carrier gas in which a molar ratio of a hydrogen gas is $1.0\times10^{-3}$ or less.

<7> A method for producing a nitride semiconductor crystal, the method including: a step of producing a gallium trichloride gas by the method for producing a gallium trichloride gas according to any one of <1> to <6>; and a step of growing a nitride semiconductor crystal including gallium on a substrate by a vapor-phase growth method using at least the gallium trichloride gas and an ammonia gas as a raw material gas.

Advantageous Effects of Invention

According to the invention, there may be provided a method for producing a gallium trichloride gas which may produce a high-purity gallium trichloride gas with good selectivity.

According to the invention, there may also be provided a method for producing a nitride semiconductor crystal which may grow a nitride semiconductor crystal including gallium at a high growth temperature and a high growth rate.

DESCRIPTION OF EMBODIMENTS

<Method for Producing Gallium Trichloride Gas>

Figure 1:
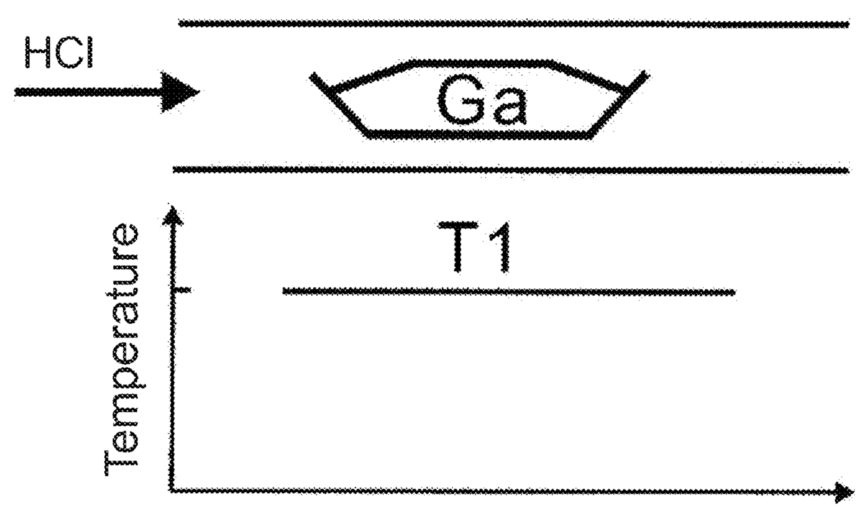
FIG. 1 is a schematic diagram showing a reaction system (Ga—HCl system) that produces GaCl by the reaction of Ga and HCl according to a conventional method.

The method for producing a gallium trichloride gas of the invention includes: a first step of reacting a metallic gallium and a chlorine gas to produce a gallium monochloride gas; and a second step of reacting the produced gallium monochloride gas and a chlorine gas to produce a gallium trichloride gas.

According to the method for producing a gallium trichloride gas of the invention, it is possible to produce a gallium trichloride gas with good selectivity in a wide range of reaction temperatures including a high temperature (for example, 500° C. or more) and prevent unreacted HCl being mixed into the produced gallium trichloride gas compared to a conventional method of reacting Ga and HCl.

Further, according to the method for producing a gallium trichloride gas of the invention, it is possible to prevent impurities (such as moisture) being mixed into the produced gallium trichloride gas compared to a conventional method of obtaining gaseous $GaCl_3$ (gallium trichloride gas) as vapor of solid $GaCl_3$.

For the above reason, according to the method for producing a gallium trichloride gas of the invention, it is possible to produce a high-purity gallium trichloride gas with good selectivity.

The gallium trichloride gas produced by the production method of the invention may be suitably used as, for example, a raw material gas in a vapor-phase growth method.

The vapor-phase growth method is not particularly limited as long as it is a vapor-phase growth method using a gallium trichloride gas as a raw material gas, and examples thereof include various methods such as CVD (Chemical Vapor Deposition) methods including a hydride vapor phase epitaxy (HVPE) method and an organometallic vapor-phase growth (Metal Organic Chemical Vapor Deposition: MOCVD) method.

Further, examples of the crystal produced by the vapor-phase growth method include a nitride semiconductor crystal including gallium, and specific examples thereof include a gallium nitride (GaN) crystal, an AlGaN ternary mixed crystal, an InGaN ternary mixed crystal and an InGaAlN quaternary mixed crystal.

Advantages of the use of a gallium trichloride gas in the production of a nitride semiconductor crystal including gallium includes the following (A) to (D).

(A) The free energy change in the reaction of $GaCl_3(g)+NH_3(g)\rightarrow GaN(s)+3HCl(g)$ is larger than the free energy change in the reaction of $GaCl(g)+NH_3(g)\rightarrow GaN(s)+HCl(g)+H_2(g)$.

Accordingly, by using $GaCl_3$, higher growth rate and growth over a wide temperature range including a high temperature may be expected.

(B) In the case of HVPE growth (growth by a HVPE method, the same applies hereinafter) of an AlGaN ternary mixed crystal, $AlCl_3$ is used as an Al raw material, and any of GaCl and $GaCl_3$ may be used as a Ga raw material.

However, in the case of using GaCl, since a Ga component tends not to be incorporated into a solid phase (because of the small free energy change), there is a disadvantage that a Ga component tends not to be incorporated into a solid phase particularly at a high temperature.

In the case of using $GaCl_3$, growth of a ternary mixed crystal may be carried out at a high temperature.

(C) In the case of HVPE growth of an InGaN ternary mixed crystal, an $InCl_3$—GaCl—$NH_3$ system and an $InCl_3$—$GaCl_3$—$NH_3$ system are considered as the reaction system.

However, in the case of an $InCl_3$—GaCl—$NH_3$ system, since the exchange reaction of $InCl_3+GaCl\rightarrow InCl+GaCl_3$ (exchange reaction of monochloride and trichloride) occurs in a gas phase, accurate solid-phase control is difficult.

On the other hand, in an $InCl_3$—$GaCl_3$—$NH_3$ system, since the exchange reaction of a monochloride and a trichloride may be suppressed, solid-phase control is easy.

(D) In the case of HVPE growth of an InGaAlN quaternary mixed crystal, since the exchange reaction of a monochloride and a trichloride in a gas phase may be suppressed by using $InCl_3$, $GaCl_3$ and $AlCl_3$ as an In raw material, a Ga raw material and an Al raw material, respectively, solid-phase control is easy during the growth of the quaternary mixed crystal.

Next, the method for producing a gallium trichloride gas of the invention is described in more detail.

The method for producing gallium trichloride ($GaCl_3$) of the invention includes two reaction steps (first step and second step).

(First Step)

The first step is a step of reacting a metallic gallium and a chlorine gas to produce a gallium monochloride gas.

The reaction in the first step is a reaction shown in the following reaction formula (1).

$$Ga(s)+\frac{1}{2}Cl_2(g)\rightarrow GaCl(g) \quad (1)$$

Here, (s) and (g) are symbols indicating that the materials are in solid and gas states, respectively.

The first step is carried out by, for example, continuously supplying a chlorine gas onto a metallic Ga so that the metallic Ga contacts the chlorine gas.

A high-purity Ga such as 7 N grade (purity 99.99999%) may be used as the metallic Ga, and a high-purity chlorine gas is preferably used as the chlorine gas.

In the first step, the chlorine gas is preferably supplied together with a carrier gas. As the carrier gas, an inert gas such as a nitrogen gas, an argon gas or a helium gas or a mixed gas containing at least one of these may be used.

The reaction temperature in the first step is preferably from 300 to 1,000° C., more preferably from 500 to 900° C., and particularly preferably from 700 to 850° C.

When the reaction temperature in the first step is 300° C. or more, the selectivity of the produced GaCl is further improved.

When the reaction temperature in the first step is 1,000° C. or less, damage to the reaction tube made of quartz or the like may be suppressed.

In the reaction in the first step, a gallium chloride gas including a gallium monochloride gas is produced as the produced gas.

The "gallium chloride" used herein represents any gallium chloride such as gallium monochloride, gallium dichloride, gallium trichloride or gallium trichloride dimer.

In the first step, a gallium chloride gas containing a gallium monochloride gas as the main component is preferably produced.

The "main component" as used herein refers to a component having the highest content ratio (molar ratio).

In the first step, the amount of the gallium monochloride gas with respect to the total amount of the produced gallium chloride gas is preferably 80% by mole or more, and more preferably 90% by mole or more.

(Second Step)

In the second step, the gallium monochloride produced in the first step and a chlorine gas are reacted. Unlike the reaction system of the first step, metallic Ga no longer exists in the reaction system of the second step.

The reaction to produce a gallium trichloride gas in the second step is a reaction represented by the following reaction formula (2).

$$GaCl(g)+Cl_2(g)\rightarrow GaCl_3(g) \quad (2)$$

The second step is carried out by, for example, continuously supplying a chlorine gas to the produced gas obtained in the first step (a gallium chloride gas including a gallium monochloride gas) so that the produced gas contacts the chlorine gas. At this time, the chlorine gas may be supplied together with a carrier gas. As the carrier gas, an inert gas such as a nitrogen gas, an argon gas or a helium gas or a mixed gas containing at least one of these may be used.

The reaction temperature in the second step is preferably from 150 to 1,000° C., more preferably from 200 to 900° C., and particularly preferably from 500 to 700° C.

When the reaction temperature in the second step is 150° C. or more, the selectivity of the produced $GaCl_3$ is further improved.

When the reaction temperature in the second step is 1,000° C. or less, damage to the reaction tube made of quartz or the like may be suppressed.

The reaction of the first step and the reaction of the second step described above may be carried out in different reaction tubes, but are preferably carried out at different locations in the same reaction tube from the viewpoint of $GaCl_3$ production efficiency.

Next, an embodiment of a method for producing a gallium trichloride gas of the invention compared to a conventional method is more specifically described with reference to the drawings.

Figure 2:
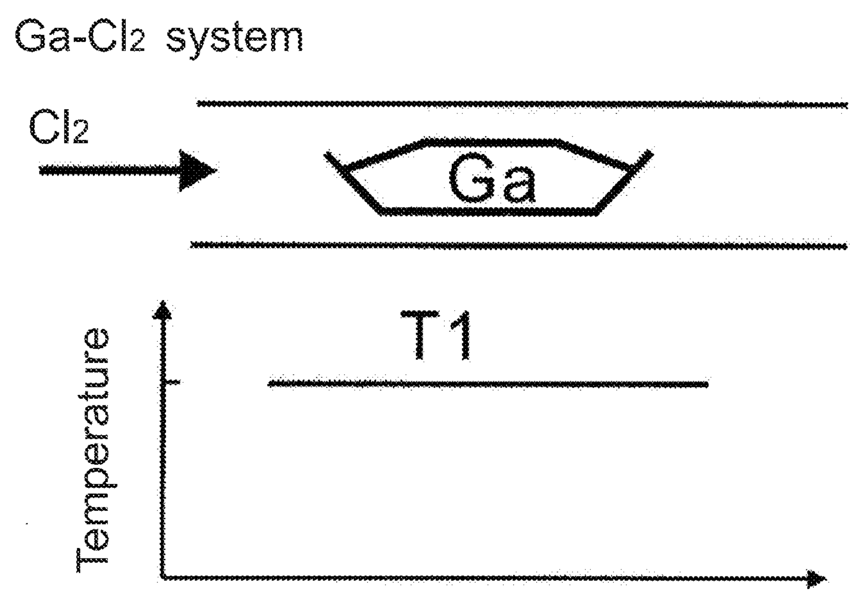
FIG. 2 is a schematic diagram showing a reaction system (Ga—$Cl_2$ system) that produces gallium chloride by the reaction of Ga and $Cl_2$ according to a reference embodiment.
Figure 3:
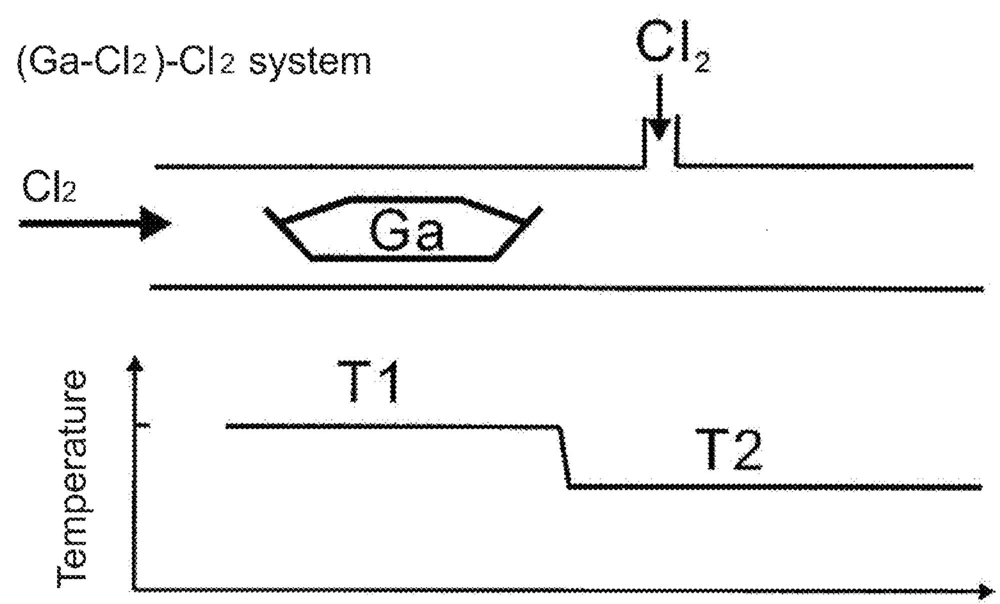
FIG. 3 is a schematic diagram showing a reaction system ((Ga—$Cl_2$)—$Cl_2$ system) according to an embodiment of the invention.

In FIGS. 1-3, the upper part shows the reaction tube configuration, and the lower part shows the relationship between the position in the reaction tube (horizontal axis) and the temperature (vertical axis).

FIG. 1 is a schematic diagram showing a reaction system (Ga—HCl system) that produces GaCl by the reaction of Ga and HCl according to a conventional method. The Ga—HCl system is conventionally used as a raw material system in a GaCl—$NH_3$ system used in HVPE growth of GaN.

As shown in FIG. 1, the Ga—HCl system is configured to have a reaction tube through which HCl and a carrier gas not shown in the figure (such as a hydrogen gas, a nitrogen gas, an argon gas or a helium gas, or a mixed gas containing at least one of these) are passed from one end to the other end, and a metallic Ga placed in the reaction tube. A crystal growth section not shown in the figure is placed at the downstream side (the downstream side with respect to the direction of the passing HCl and carrier gas, the same applies hereinafter) of the reaction tube shown in FIG. 1.

In the Ga—HCl system, HCl and a carrier gas not shown in the figure are supplied from one end of the reaction tube to the inside of the reaction tube, and the supplied HCl and a metallic Ga are reacted at a reaction temperature T1.

In the Ga—HCl system, Ga and HCl are reacted at a reaction temperature T1 to produce GaCl, $GaCl_3$, and $GaCl_2$. When the reaction temperature T1 is 500° C. or more, most of the produced product is GaCl. The produced product is transported to a crystal growth section (not shown in the figure) placed at the downstream side of the reaction tube shown in FIG. 1.

In the Ga—HCl system, the generation ratio of $GaCl_3$ increases with the decrease of the reaction temperature. However, since the reaction rate decreases with the decrease of the reaction temperature, a reaction temperature of 500° C. or less is not suitable. For this reason, a Ga raw material in general HVPE growth is kept at from 700° C. to 850° C.

FIG. 2 is a schematic diagram showing a raw material system (Ga—$Cl_2$ system) in which $Cl_2$ is supplied onto a metallic Ga according to a reference embodiment.

As shown in FIG. 2, the Ga—$Cl_2$ system is configured to have a reaction tube through which $Cl_2$ and a carrier gas not shown in the figure are passed from one end to the other end, and a metallic Ga placed in the reaction tube. A crystal growth section not shown in the figure is placed at the downstream side of the reaction tube shown in FIG. 2.

In the Ga—$Cl_2$ system, $Cl_2$ and a carrier gas not shown in the figure are supplied onto the metallic Ga placed in the reaction tube, and the supplied $Cl_2$ and the metallic Ga are reacted at a reaction temperature T1.

As the carrier gas in the Ga—$Cl_2$ system, an inert gas such as a nitrogen gas, an argon gas or a helium gas or a mixed gas containing at least one of these may be used. Since a hydrogen gas reacts with $Cl_2$, a hydrogen gas may not be used as a carrier gas.

Also in the Ga—$Cl_2$ system, GaCl is a main component at a reaction temperature of 500° C. or more, and the generation amount of $GaCl_3$ may be increased at a lower temperature. However, a reaction temperature of 500° C. or less may not be recommended from the viewpoint of the reaction rate.

FIG. 3 is a schematic diagram showing an embodiment of the invention.

The embodiment of the invention is a (Ga—$Cl_2$)—$Cl_2$ system in which a produced gas that is produced by the reaction of a metallic gallium and a chlorine gas, and a chlorine gas are reacted.

As shown in FIG. 3, the embodiment of the invention ((Ga—$Cl_2$)—$Cl_2$ system) is configured to have a reaction tube through which $Cl_2$ and a carrier gas not shown in the figure are passed from one end to the other end, and a metallic Ga placed in the reaction tube. The reaction tube is provided with a $Cl_2$ supply port that is placed at the downstream side (the downstream side with respect to the direction of the passing $Cl_2$ and carrier gas, the same applies hereinafter) with respect to the metallic Ga. Further, a crystal growth section not shown in the figure is placed at the downstream side of the reaction tube shown in FIG. 3.

In the embodiment, $Cl_2$ and a carrier gas not shown in the figure are supplied from one end of the reaction tube, and the supplied $Cl_2$ and a metallic Ga are reacted at a reaction temperature T1 (first step). The produced gas that is produced by the first step (a gallium chloride gas including a gallium monochloride gas) is transported to the downstream side, and the transported produced gas and $Cl_2$ introduced from the $Cl_2$ supply port are reacted at a reaction temperature T2 (second step). The produced gas obtained in the second step is transported to the crystal growth section (not shown in the figure) placed at the downstream side of the reaction tube shown in FIG. 3.

In this way, the reaction system of the embodiment is configured by a first zone which is an area upstream from the $Cl_2$ supply port and where the reaction in the first step is carried out, and a second zone which is a downstream area including the $Cl_2$ supply port and where the reaction in the second step is carried out.

As the carrier gas in the (Ga—$Cl_2$)—$Cl_2$ system, an inert gas such as a nitrogen gas, an argon gas, a helium gas or a mixed gas containing at least one of these may be used.

The following reactions are carried out in the first zone (first step) and the second zone (second step).

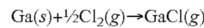

$$Ga(s)+\tfrac{1}{2}Cl_2(g)\rightarrow GaCl(g) \qquad \text{Reaction in first zone:}$$

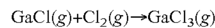

$$GaCl(g)+Cl_2(g)\rightarrow GaCl_3(g) \qquad \text{Reaction in second zone:}$$

The reaction temperature T1 in the first zone (first step) is preferably 300° C. or more, more preferably 500° C. or more, and particularly preferably 700° C. or more from the viewpoint of increasing the reaction rate.

The reaction temperature T2 in the second zone (second step) is not particularly limited, and a wide range of a temperature may be selected. However, the lower limit of the reaction temperature T2 is preferably a temperature such that GaCl supplied from the first zone is not deposited on the reaction tube wall. From such a viewpoint, the reaction temperature T2 is preferably 150° C. or more, more preferably 200° C. or more, and particularly preferably 500° C. or more.

Preferably, the amount of $Cl_2$ supplied from the $Cl_2$ supply port in the second zone is substantially the same as that of GaCl supplied from the first zone to the second zone from the viewpoint of further increasing the selectivity of the produced $GaCl_3$.

Figure 4:
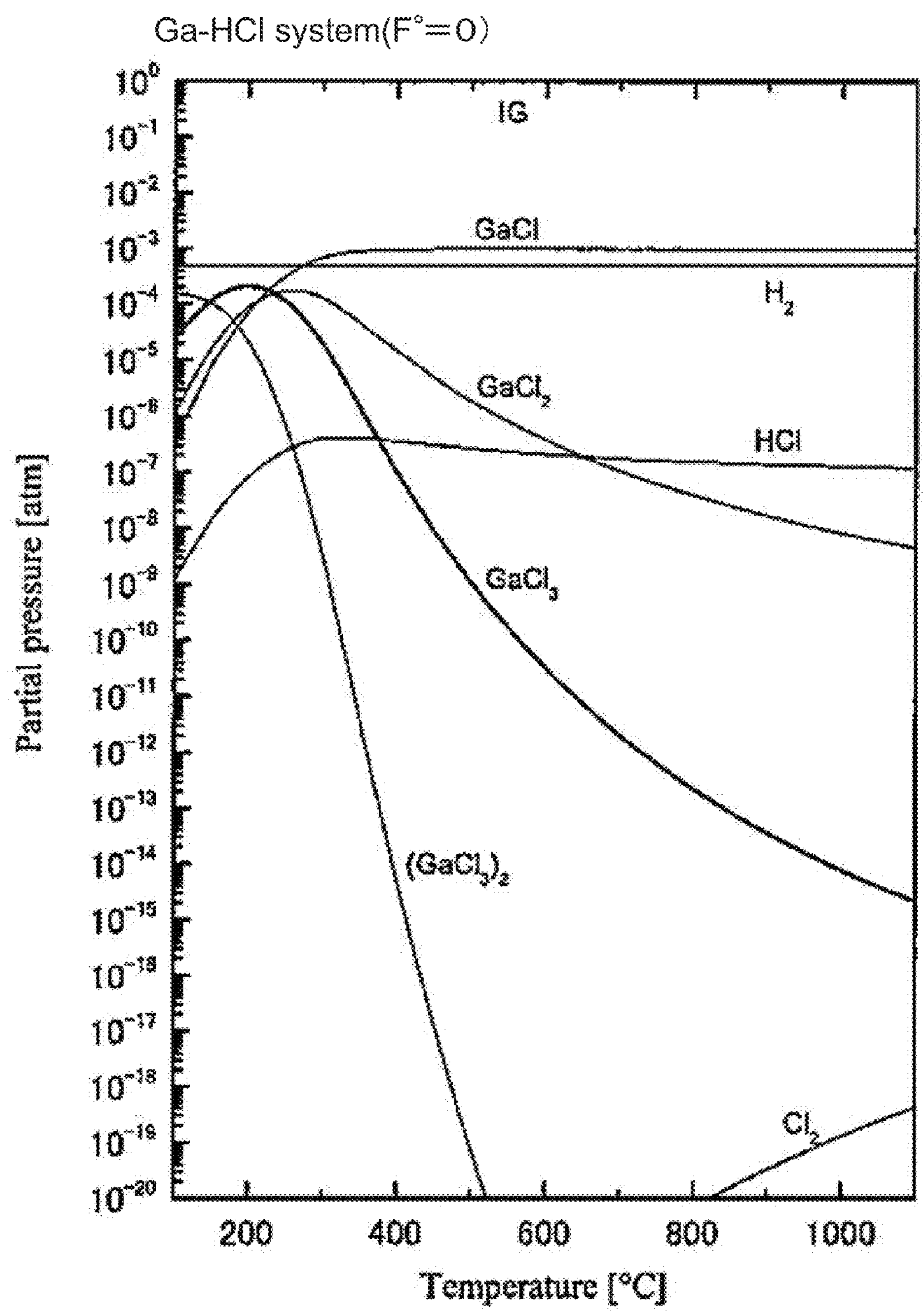
FIG. 4 is a graph showing the relationship between the reaction temperature and the generated partial pressure (equilibrium partial pressure) of the Ga chloride in the reaction system (Ga—HCl system) shown in FIG. 1.

FIG. 4 is a graph showing the relationship between the reaction temperature and the generated partial pressure (equilibrium partial pressure) of the Ga chloride in the reaction system (Ga—HCl system) shown in FIG. 1. This relationship was determined by a thermodynamic method.

Detailed conditions in FIG. 4 are as follows.

Conditions

Pressure in system: ($\Sigma P_i$): 1.0 atm

Partial pressure of supplied hydrogen chloride ($P^o_{HCl}$): $1\times10^{-3}$ atm Hydrogen ratio in carrier gas ($F^o$):0

In FIG. 4, a case in which an inert gas such as a nitrogen gas is used as a carrier gas ($F^o$=0) is shown, but if a hydrogen gas is used as a carrier gas, no major change occurs.

"IG" in FIGS. 4 to 7 represents an inert gas including a nitrogen gas.

As shown in FIG. 4, the partial pressures of $GaCl_2$ and $GaCl_3$ increase and the partial pressure of GaCl decreases in the range in which the reaction temperature is 400° C. or less.

On the other hand, since the decrease of the reaction temperature decreases the reaction rate of the metallic Ga and HCl (hydrogen chloride), in addition to the raw material gas that is a Ga chloride, unreacted HCl is transported to the crystal growth section of a crystal.

Accordingly, in order to stably supplying a raw material to the crystal growth section, a reaction temperature of 500° C. or more is preferable. As shown in FIG. 4, at a temperature of 500° C. or more where stable raw material supply to the crystal growth section is expected, GaCl is a main component, and $GaCl_3$ is less than GaCl by five or more orders of magnitude.

Figure 5:
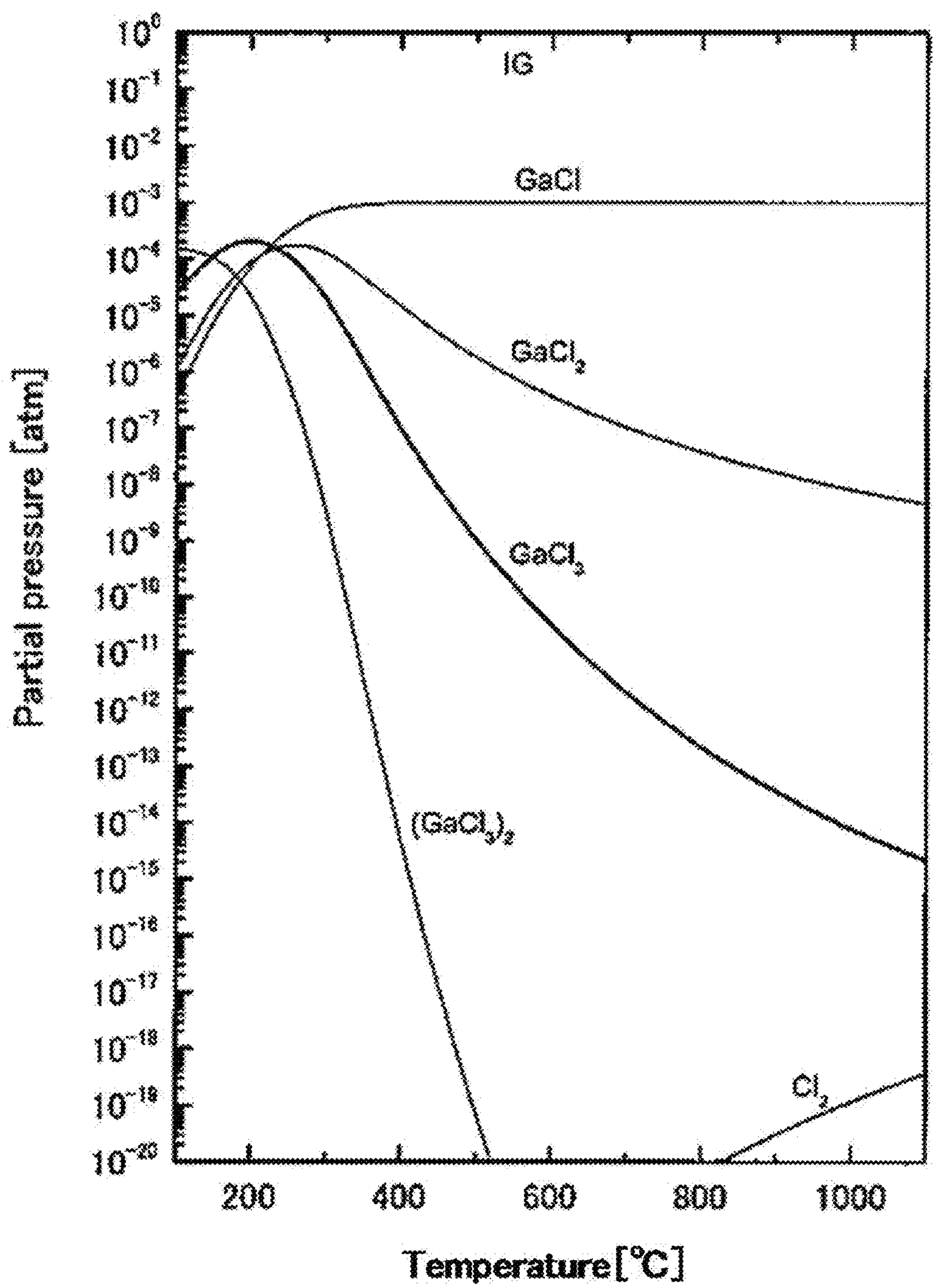
FIG. 5 is a graph showing the relationship between the reaction temperature and the generated partial pressure (equilibrium partial pressure) of the Ga chloride in the reaction system (Ga—$Cl_2$ system) shown in FIG. 2.

FIG. 5 is a graph showing the relationship between the reaction temperature and the generated partial pressure (equilibrium partial pressure) in the Ga—$Cl_2$ system shown in FIG. 2. This relationship was determined by a thermodynamic method.

Detailed conditions in FIG. 5 are as follows.

Conditions

Pressure in system ($\Sigma P_i$): 1.0 atm

Partial pressure of supplied chlorine ($P^o_{Cl2}$): $5\times10^{-4}$ atm

Hydrogen ratio in carrier gas) ($F^o$):0

When hydrogen and chlorine are mixed, a rapid reaction to produce HCl occurs. Accordingly, in the Ga—$Cl_2$ system, since hydrogen cannot be used as a carrier gas, an inert gas including a nitrogen gas is used as a carrier gas.

As shown in FIG. 5, the partial pressure change in the Ga—$Cl_2$ system is similar to the partial pressure change in the Ga—HCl system, and $GaCl_3$ is less than GaCl by five or more orders of magnitude at a reaction temperature of 500° C. or more.

Figure 6:
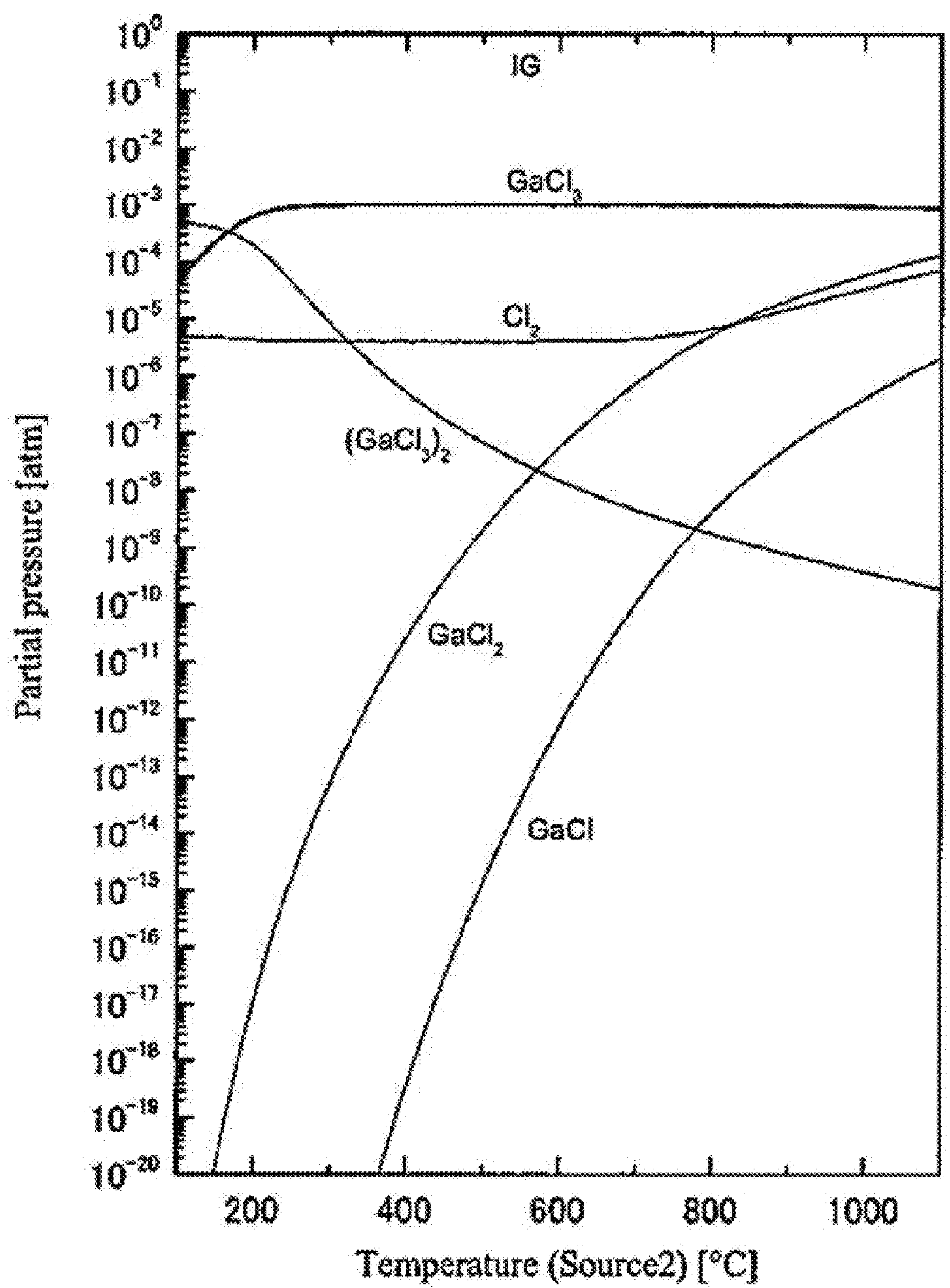
FIG. 6 is a graph showing the relationship between the reaction temperature (T2) and the generated partial pressure (equilibrium partial pressure) of the Ga chloride in the second step in the reaction system ((Ga—$Cl_2$)—$Cl_2$ system) according to the embodiment of the invention shown in FIG. 3.

FIG. 6 is a graph showing the relationship between the reaction temperature (T2) and the generated partial pressure (equilibrium partial pressure) of the Ga chloride in the second step in the embodiment (($Ga—Cl_2$)—$Cl_2$ system) of the invention shown in FIG. 3. This relationship was determined by a thermodynamic method.

In FIG. 6, the reaction temperature T2 is represented by "Temperature (Source2)".

Detailed conditions in FIG. 6 are as follows.

Conditions

Pressure in system ($\Sigma P_i$): 1 atm

Partial pressure of supplied chlorine ($P^o_{Cl2\ Source1}$) in first step: $5.0\times10^{-4}$ atm Partial pressure of supplied chlorine ($P^o_{Cl2\ Source2}$) in second step: $1.0\times10^{-3}$ atm Reaction temperature (T1) in first step: 800° C.

In the ($Ga—Cl_2$)—$Cl_2$ system, the reaction temperature T1 is preferably 500° C. or more from the viewpoint of increasing the reaction rate as mentioned above. From such a viewpoint, the reaction temperature T1 was 800° C. in FIG. 6.

As shown in FIG. 6, in the ($Ga—Cl_2$)—$Cl_2$ system, $GaCl_3$ is effectively obtained over wide reaction temperatures T2. This is because a metallic Ga does not exist in the second step.

In particular, the partial pressure of $GaCl_3$ is high in a range where the reaction temperature T2 is 150° C. or more, wherein the main component of the Ga chlorides is $GaCl_3$ in a range where the reaction temperature T2 is 200° C. or more.

In a range where the reaction temperature T2 is less than 200° C., the partial pressure of the dimer of $GaCl_3$ represented by $(GaCl_3)_2$ increases and the partial pressure of $GaCl_3$ decreases, but the sum of the partial pressure of $(GaCl_3)_2$ and the partial pressure of $GaCl_3$ is $1\times10^{-3}$ atm and constant. Even in a range where the reaction temperature T2 is less than 200° C., a sufficient amount of $GaCl_3$ may be supplied to the crystal growth section. This is because $(GaCl_3)_2$ produced in the raw material section is transported to the crystal growth section carried out at around 1,000° C. and is thereby changed to $GaCl_3$.

Figure 7:
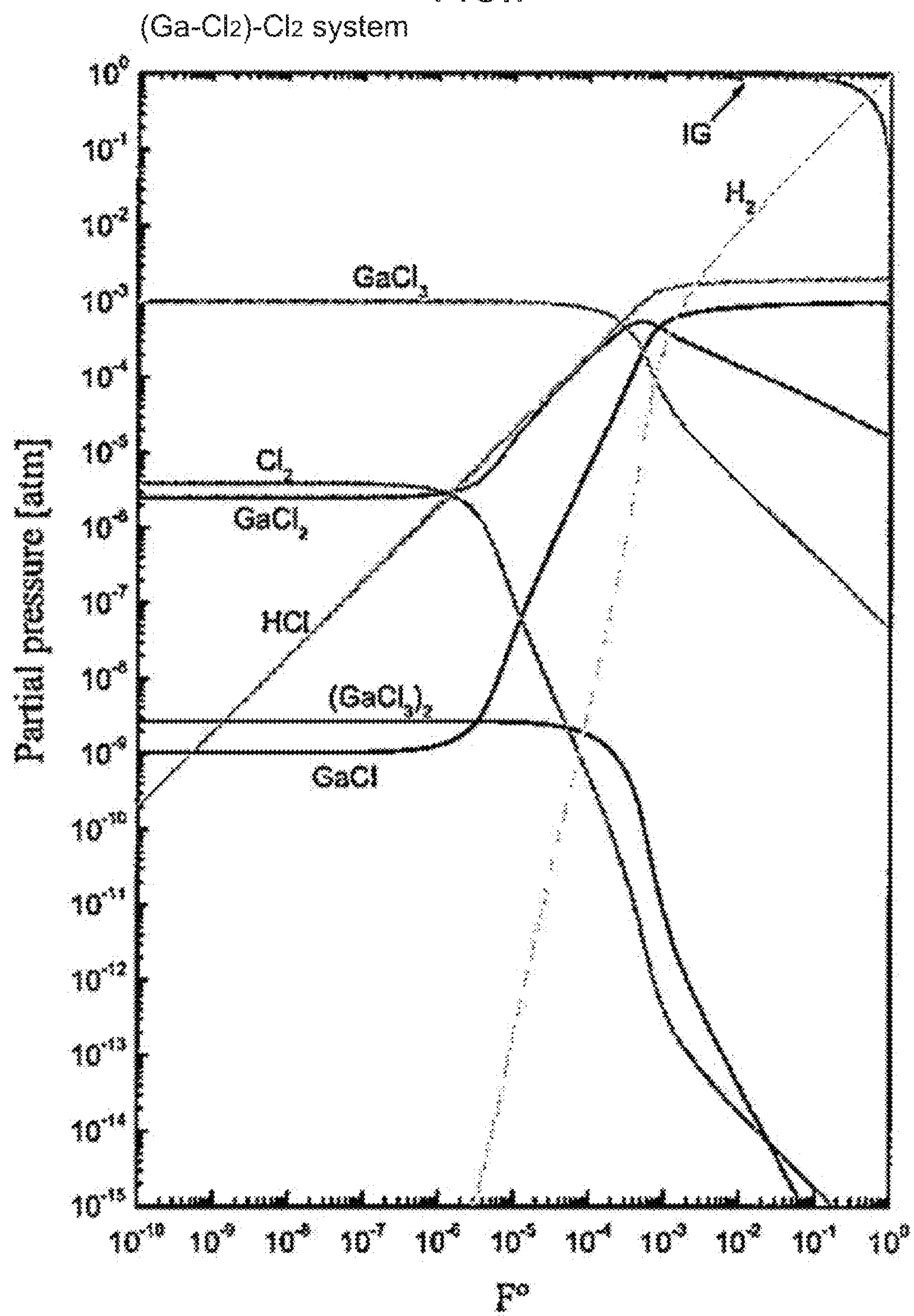
FIG. 7 is a graph showing the relationship between the hydrogen ratio in the carrier gas) (F°) and the equilibrium partial pressure in the second step of the embodiment of the invention shown in FIG. 3.

FIG. 7 is a graph showing the relationship between the content ratio (molar ratio) of the hydrogen gas in the carrier gas and the generated partial pressure (equilibrium partial pressure) of the Ga chloride in the embodiment (($Ga—Cl_2$)—$Cl_2$ system) of the invention shown in FIG. 3.

Detailed conditions in FIG. 7 are as follows.

Conditions

Pressure in system ($\Sigma P_i$): 1.0 atm

Partial pressure of supplied chlorine ($P^o_{Cl2\ Source1}$) in first step: $5.0\times10^{-4}$ atm Partial pressure of supplied chlorine ($P^o_{Cl2\ Source2}$) in second step: $1.0\times10^{-3}$ atm Reaction temperature (T1) in first step: 750° C.

Reaction temperature (T1) in second step: 750° C.

In FIG. 7, ($F^o$) represents the ratio (molar ratio) of the hydrogen gas in the carrier gas, which is the same value as that of the hydrogen partial pressure in the carrier gas at normal pressure that is commonly used. The carrier gas used herein includes an inert gas including a nitrogen gas, and a hydrogen gas.

As shown in FIG. 7, when the partial pressure of a hydrogen gas becomes $1\times10^{-3}$ atm or more, the partial pressure of a $GaCl_3$ gas rapidly decreases and the partial pressure of a GaCl gas increases. Accordingly, in this embodiment, the hydrogen partial pressure is preferably decreased to a partial pressure that does not affect the equilibrium partial pressure of $GaCl_3$.

When focusing on the ratio (molar ratio; $F^0$) of the hydrogen gas in the carrier gas, $F^0$ is preferably $1.0\times10^{-3}$ or less, and more preferably $1.0\times10^{-4}$ or less from the viewpoint of increasing the selectivity of a $GaCl_3$ gas.

$GaCl_3$ produced by the method for producing a gallium trichloride gas of the invention as described above may be used for producing a GaN free-standing substrate crystal used as a substrate crystal for a next generation DVD laser, a substrate crystal for a high-brightness/high-efficiency LED, or a substrate crystal for a high-efficiency electronically-controlled device; an AlGaN thick film crystal used as a substrate crystal for a UV light-emitting device; an InGaN thick film crystal used as a substrate crystal for high-efficiency visible light LD and LED; and the like.

<Method for Producing Nitride Semiconductor Crystal>

The method for producing a nitride semiconductor crystal of the invention includes a step of producing a gallium trichloride gas by the method for producing a gallium trichloride gas of the invention described above (hereinafter also referred to as "gallium trichloride gas-producing step") and a step of growing a nitride semiconductor crystal including gallium on a substrate by a vapor-phase growth method using at least the gallium trichloride gas and an ammonia gas as a raw material gas (hereinafter also referred to as "growing step").

According to the method for producing a nitride semiconductor crystal of the invention, since it is possible to grow a nitride semiconductor crystal including gallium using a gallium trichloride-ammonia system ($GaCl_3$—$NH_3$ system) as a reaction system, it is possible to grow a nitride semiconductor crystal including gallium at a high growth temperature and a high growth rate. Further, according to the method for producing a nitride semiconductor crystal of the invention, since it is possible to increase the growth temperature of the nitride semiconductor crystal, it is possible to carry out rapid growth of the nitride semiconductor crystal with high quality.

Further, by separating the nitride semiconductor crystal produced by the method for producing a nitride semiconductor crystal of the invention from the substrate by a known method, it is possible to produce a free-standing substrate of a nitride semiconductor crystal.

The gallium trichloride gas-producing step is the same as the method for producing a gallium trichloride gas of the invention described above, and the preferable ranges are also the same.

As the growing step, a method known as a vapor-phase growth method of a nitride semiconductor crystal including gallium may be used except for using a gallium trichloride gas as a raw material gas.

Hereinafter, an embodiment of the method for producing a nitride semiconductor crystal of the invention is described with reference to FIG. 8.

Figure 8:
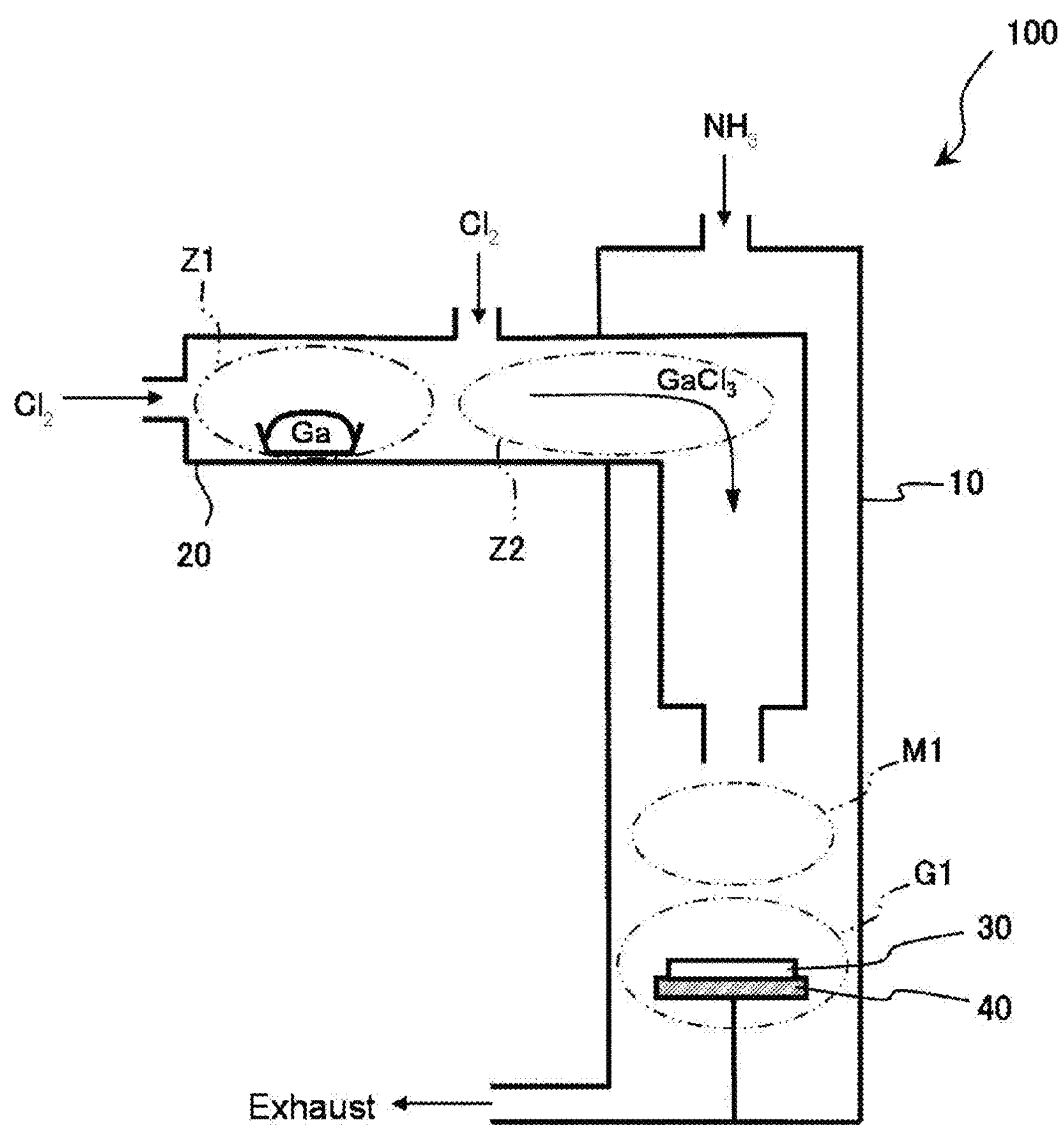
FIG. 8 is a schematic diagram showing an apparatus for producing a nitride semiconductor crystal, which is suitable for carrying out an embodiment of a method for producing a nitride semiconductor crystal of the invention.

FIG. 8 is a schematic diagram showing an apparatus for producing a nitride semiconductor crystal, which is suitable for carrying out an embodiment of a method for producing a nitride semiconductor crystal of the invention.

As shown in FIG. 8, the apparatus 100 for producing a nitride semiconductor crystal has a reaction tube 10 for growing a nitride semiconductor crystal including gallium by a vapor-phase growth method, and a reaction tube 20 for producing a gallium trichloride gas that is a part of a raw material gas in the vapor-phase growth method, the reaction tube 20 communicating with the reaction tube 10 in a sealed condition.

As shown in FIG. 8, the reaction tube 20 has a first zone Z1 where the above-described reaction in the first step is carried out, and a second zone Z2 where the above-described reaction in the second step is carried out.

A metallic gallium (Ga) is placed in the first zone Z1 of the reaction tube 20. The reaction tube 20 further has a first supply port for supplying a chlorine gas $Cl_2$ (optionally together with a carrier gas) to the first zone Z1, a second supply port for supplying a chlorine gas $Cl_2$ (optionally together with a carrier gas) to the second zone Z2, and an exhaust port for exhausting a produced gallium trichloride gas $GaCl_3$ Further, external heating means (such as a resistance heater, a high-frequency heater or a lamp heater) not shown in the figure is placed on the outside of the reaction tube 20, and the first zone Z1 and the second zone Z2 may be each independently heated by the external heating means. Here, the external heating means may be means capable of heating the first zone Z1 and the second zone Z2 simultaneously. Further, the apparatus 100 for producing a nitride semiconductor crystal may further have heating means capable of heating the metallic gallium independently, in addition to the external heating means.

As the material of the reaction tube 20, a material such as quartz may be used which is known as a material of a reaction tube used in a HVPE method.

As the carrier gas, for example, a nitrogen gas, an argon gas or a helium gas or a mixed gas containing at least one of these may be used.

The others in the configuration of the reaction tube 20 are the same as those in the embodiment of the method for producing a gallium trichloride gas of the invention shown in FIG. 3, and the preferable ranges are also the same.

Further, as shown in FIG. 8, the reaction tube 10 has a susceptor 40 for holding a substrate 30, an ammonia gas supply port for supplying ammonia gas ($NH_3$) from the outside, and an exhaust port for exhausting the reaction tube 10.

In the middle of the reaction tube 10, the reaction tube 20 is inserted in a sealed condition. The apparatus 100 for producing a nitride semiconductor crystal is configured so that the exhaust port in the reaction tube 20 is located inside the reaction tube 10.

As the susceptor 40, a carbon susceptor or the like capable of directly heating the substrate 30 may be used. Further, the susceptor 40 is connected to a power supply (not shown in the figure) to supply electric power required for crystal growth.

As the substrate 30, a single crystal substrate may be used such as a sapphire (0001) substrate, a silicon carbide substrate or a gallium nitride substrate.

Inside the reaction tube 10, the area downstream from the exhaust port of the reaction tube 20 is a gas mixing section M1. In the gas mixing section M1, $GaCl_3$ and $NH_3$ (and optionally a carrier gas) are mixed.

Further, inside the reaction tube 10, the area that is downstream from the gas mixing section M1 and includes the susceptor 40 is a crystal growth section G1. In the crystal growth section G1, growth of a nitride semiconductor crystal is carried out by a vapor-phase reaction growth method.

Exhaust means not shown in the figure is connected to the exhaust port of the reaction tube 10. Due to the exhaust means, it is possible to exhaust the inside of the reaction tube 10 or adjust the pressure (total pressure) in the reaction tube 10 to be a constant value.

Further, external heating means (such as a resistance heater, a high-frequency heater or a lamp heater) not shown in the figure is placed on the outside of the reaction tube 10, and the whole of the reaction tube 10 may be heated by the external heating means.

As the material of the reaction tube 10, a material such as quartz may be used which is known as a material of a reaction tube used in a HVPE method.

The others in the configuration of the reaction tube 10 may be those in the configuration of a reaction tube known in a HVPE method such as those described in WO 2008/108381, JP-A No. 2005-252248, JP-A No. 2007-220927 and the like.

Hereinafter, an example of the production of a nitride semiconductor crystal using the apparatus 100 for producing a nitride semiconductor crystal is described.

First, the substrate 30 is set on the susceptor 40 in the reaction tube 10, and then the carrier gas is flowed in the reaction tubes 10 and 20 so that the atmosphere in the reaction tubes 10 and 20 is a carrier gas atmosphere.

Subsequently, the substrate 30 is heated at a temperature of, for example, around 1,000 to 1,100° C. for 1 to 10 minutes by heating by at least one of the susceptor 40 and the external heating means to remove an organic material adhering to the surface of the substrate 30 (thermal cleaning). After the completion of the thermal cleaning, the substrate 30 is heated at a predetermined growth temperature (for example, 1,000° C. or more but less than 1200° C.).

The pressure in the reaction tube 10 is adjusted to be a constant value (for example, 0.8 to 1.2 atm) by the external exhaust means.

Subsequently, the production of $GaCl_3$ that is a part of the raw material gas is carried out in the reaction tube 20.

Specifically, while the first zone Z1 and the second zone Z2 of the reaction tube 20 are heated, a carrier gas and a chlorine gas are supplied to the first zone Z1, and a carrier gas and a chlorine gas are supplied to the second zone Z2.

In the first zone Z1, the metallic Ga and the chlorine gas are reacted (first step), and the produced gas containing GaCl obtained in this reaction is transported to the second zone Z2. In the second zone Z2, GaCl in the produced gas and the chlorine gas supplied to the second zone Z2 are reacted (second step), so that a produced gas containing $GaCl_3$ is obtained.

In the above process, the temperature of the first zone Z1 (the reaction temperature in the first step) and the temperature of the second zone Z2 (the reaction temperature in the second step) are adjusted to predetermined temperatures. Preferable ranges of the reaction temperature in the first step and the reaction temperature in the second step are as described above.

The produced gas containing $GaCl_3$ produced in the second zone Z2 is discharged to the gas mixing section M1 of the reaction tube 10.

On the other hand, $NH_3$ is supplied optionally together with a carrier gas (a nitrogen gas, an argon gas or a helium gas or a mixed gas containing at least one of these) to the reaction tube 10 by external gas supply means (not shown in the figure). The supplied $NH_3$ is mixed with the produced gas containing $GaCl_3$ in the gas mixing section M1.

In this manner, a raw material gas containing $GaCl_3$ and $NH_3$ may be obtained.

In the above conditions, by supplying predetermined electric power to the substrate 30 through the susceptor 40, a nitride semiconductor crystal including gallium (such as a gallium nitride crystal) is grown on the substrate 30 by a vapor-phase growth method using the raw material gas.

In the above manner, it is possible to grow a nitride semiconductor crystal including gallium at a high growth temperature and a high growth rate by a vapor-phase growth method ($GaCl_3$—$NH_3$ system) using $GaCl_3$ and $NH_3$ as a raw material gas using the apparatus 100 for producing a nitride semiconductor crystal.

EXAMPLES

Hereinafter, the invention is further specifically described with reference to the Examples, but the invention is not limited to the following Examples.

Example 1

Genaration of GaN Crystal Film by $GaCl_3$—$NH_3$ System

A gallium nitride (GaN) crystal film was grown on a substrate 30 using a $GaCl_3$—$NH_3$ system as a reaction system using an apparatus 100 for producing a nitride semiconductor crystal.

The detailed conditions of the apparatus 100 for producing a nitride semiconductor crystal were as follows.

As the metallic Ga in the reaction tube 20, a metallic Ga of 7 N grade (purity 99.99999%) was used.

A nitrogen gas (carrier gas) and a chlorine gas were supplied to the first zone Z1 of the reaction tube 20. At this time, the supply amounts of the nitrogen gas and the chlorine gas were adjusted so that the partial pressure of the chlorine gas was $8.0\times10^{-3}$ atm and the total pressure was 1 atm in the first zone Z1. The reaction temperature in the first zone Z1 (that is, the reaction temperature T1 in the first step) was 750° C.

A nitrogen gas (carrier gas) and a chlorine gas were supplied to the second zone Z2 of the reaction tube 20. At this time, the supply amounts of the nitrogen gas and the chlorine gas were adjusted so that the partial pressure of the chlorine gas was $1.6\times10^{-2}$ atm and the total pressure was 1 atm in the second zone Z2. The reaction temperature in the second zone Z2 (that is, the reaction temperature T2 in the second step) was 750° C.

In the reaction tube 10, a sapphire (0001) substrate was used as the substrate 30. As the susceptor 40, a susceptor consisting of a composite sintered material of aluminum nitride and boron nitride and having a carbon heat generator was used.

A nitrogen gas (carrier gas) and an ammonia gas were supplied to the reaction tube 10. At this time, the exhaust rate and the supply amounts of the nitrogen gas (carrier gas) and the ammonia gas ($NH_3$) were adjusted so that the partial pressure ($P^o_{NH3}$) of $NH_3$ in the reaction tube 10 was $2.0\times10^{-1}$ atm and the partial pressure ($P^o_{CaCl3}$) of $GaCl_3$ in the reaction tube 10 was $8.0\times10^{-3}$ atm.

Under the above-described conditions, the relationship between the growth temperature [° C.] and the growth rate [μm/h] was measured. Here, the growth temperature is a temperature of the sapphire (0001) substrate.

Figure 9:
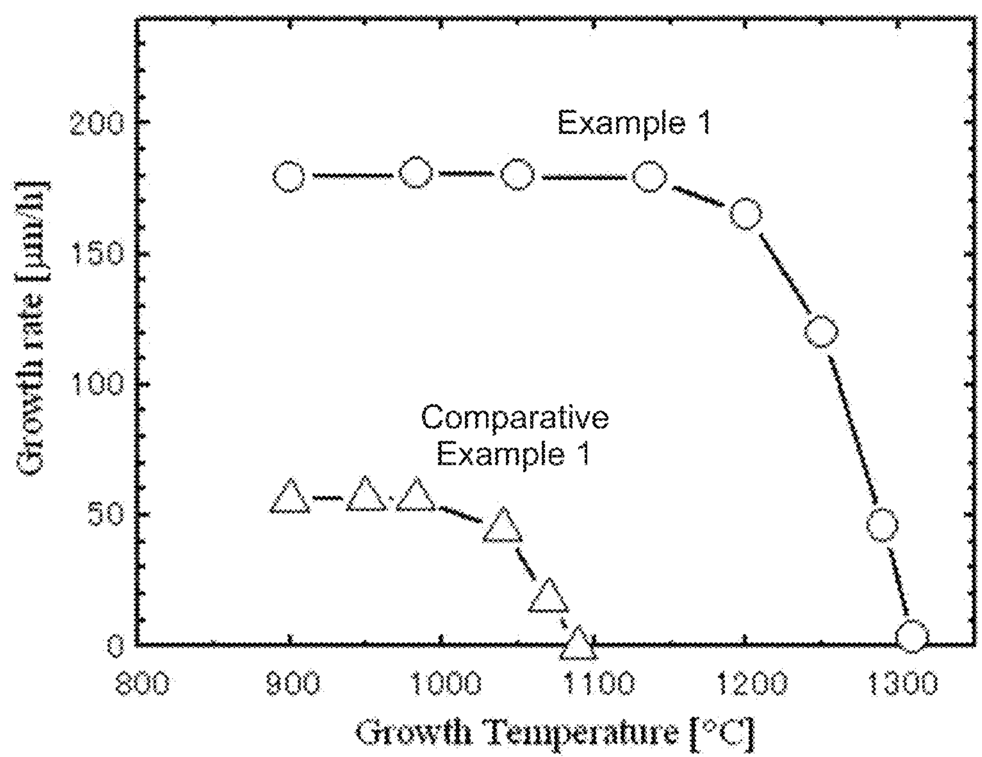
FIG. 9 is a graph showing the relationship between the growth temperature [° C.] and the growth rate [μm/h] with respect to Example 1 and Comparative Example 1.

The obtained relationship between the growth temperature [° C.] and the growth rate [μm/h] is shown in FIG. 9.

Next, the growth temperature was fixed at 1150° C. and a GaN crystal film having a thickness of 30 μm was formed.

The surface of the obtained GaN crystal film was observed using a scanning electron microscope (SEM). The obtained SEM image is shown in the lower part in FIG. 10.

Further, for the same GaN crystal film, a photoluminescence (PL) spectrum was measured at room temperature using an ArF excimer laser (PSX-100, manufactured by MPB Communications Inc.) at a wavelength of 193 nm.

Figure 10:
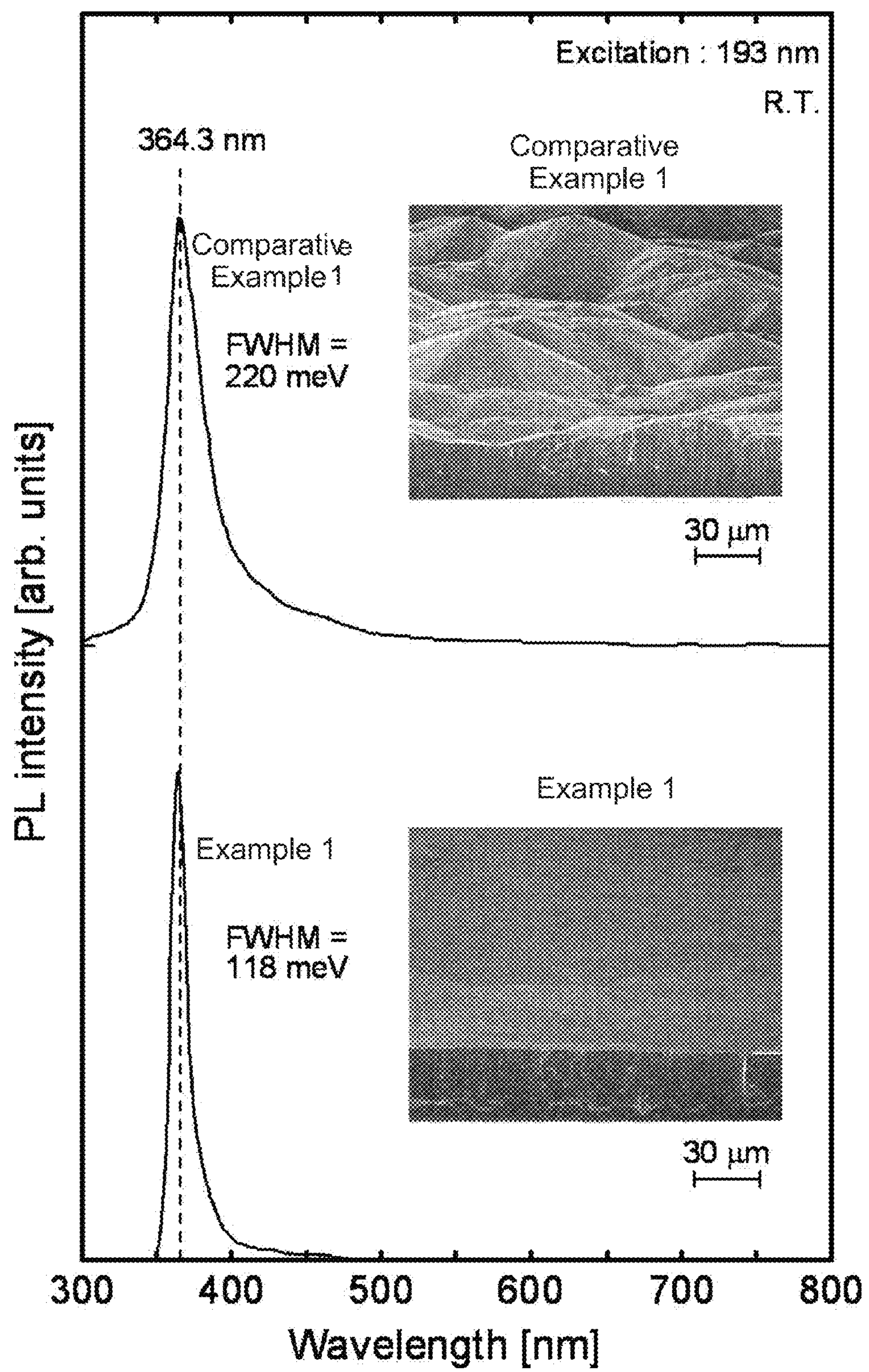
FIG. 10 is a diagram showing a photoluminescence (PL) spectrum and a SEM image with respect to Example 1 and Comparative Example 1.

The measured photoluminescence (PL) spectrum is shown in the lower part in FIG. 10.

Comparative Example 1

Production of GaN Crystal Film by GaCl—$NH_3$ System

As Comparative Example 1, production of a GaN crystal film was carried out using a GaCl—$NH_3$ system. Detailed operations are shown below.

First, an apparatus (comparative) for producing a nitride semiconductor crystal was prepared by replacing the reaction tube 20 with a reaction tube of a conventional Ga—HCl system as shown in FIG. 1 in the apparatus 100 for producing a nitride semiconductor crystal of Example 1.

A nitrogen gas (carrier gas) and a hydrogen chloride gas (HCl) were supplied to the reaction tube of the Ga—HCl system of the apparatus (comparative) for producing a nitride semiconductor crystal. At this time, the supply amounts of the nitrogen gas and the hydrogen chloride gas (HCl) were adjusted so that the partial pressure of HCl was $8.0\times10^{-3}$ atm and the total pressure was 1 atm. The reaction temperature was 750° C.

The configuration of the reaction tube 10 is the same as that in Example 1.

A nitrogen gas (carrier gas) and an ammonia gas were supplied to the reaction tube 10. At this time, the exhaust rate and the supply amounts of the nitrogen gas (carrier gas) and the ammonia gas ($NH_3$) were adjusted so that the partial pressure ($P^o_{NH3}$) of $NH_3$ in the reaction tube 10 was $2.0\times10^{-1}$ atm and the partial pressure ($P^o_{CaCl}$) of GaCl in the reaction tube 10 was $8.0\times10^{-3}$ atm.

Under the above-described conditions, the relationship between the growth temperature [° C.] and the growth rate [μm/h] was measured. Here, the growth temperature is a temperature of the sapphire (0001) substrate.

The obtained relationship between the growth temperature [° C.] and the growth rate [μm/h] is shown in FIG. 9.

Next, the growth temperature was fixed at 970° C. and a GaN crystal film having a thickness of 30 μm was formed.

The surface of the obtained GaN crystal film was observed using a scanning electron microscope (SEM). The obtained SEM image is shown in the upper part in FIG. 10.

Further, for the same GaN crystal film, a photoluminescence (PL) spectrum was measured at room temperature using an ArF excimer laser having a wavelength of 193 nm (PSX-100, manufactured by MPB Communications Inc.).

The measured photoluminescence (PL) spectrum is shown in the upper part in FIG. 10.

<Measurement Results>

FIG. 9 is a graph showing the relationship between the growth temperature [° C.] and the growth rate [μm/h] with respect to Example 1 and Comparative Example 1.

As shown in FIG. 9, Example 1 exhibited a considerably-high growth rate in all the growth temperatures compared to Comparative Example 1. Example 1 exhibited a growth rate of 180 μm/h particularly in the region where the growth temperature was 1150° C. or less.

Further, in Example 1, it was possible to carry out crystal growth in wide growth temperatures including a high temperature, compared to Comparative Example 1. That is, in Example 1, it was possible to carry out crystal growth even in the range (specifically, 1100° C. to 1300° C.) exceeding the upper limit of the growth temperature in Comparative Example 1.

FIG. 10 is a diagram showing a photoluminescence (PL) spectrum and a SEM image with respect to Example 1 and Comparative Example 1.

In FIG. 10, the upper part is a result of Comparative Example 1, and the lower part is a result of Example 1.

As shown in FIG. 10, in Example 1, the peak intensity of the photoluminescence (PL) spectrum (PL intensity) is high and the full width at half maximum (FWHM) of the peak was small compared to Comparative Example 1. From this result, it was confirmed that the crystal film of Example 1 has a higher-quality crystal structure than the crystal film of Comparative Example 1.

Further, as shown in the SEM images in FIG. 10, it was confirmed that in Example 1, a high-quality crystal film having high surface flatness was obtained compared to Comparative Example 1.

The disclosure of Japanese Patent Application No. 2010-110064 is entirely incorporated herein by reference.

All publications, patent applications, and technical standards mentioned in this specification are herein incorporated by reference to the same extent as if each individual publication, patent application, or technical standard was specifically and individually indicated to be incorporated by reference.

The invention claimed is:

1. A method for producing a gallium trichloride gas, the method comprising:

a first step of reacting a metallic gallium and a chlorine gas to produce a gallium monochloride gas; and a second step of reacting the produced gallium monochloride gas and a chlorine gas at a temperature of from 700 to 1,000° C. to produce a gallium trichloride gas.

2. The method for producing a gallium trichloride gas according to claim 1, wherein in the first step, the reaction of the metallic gallium and the chlorine gas is carried out at a temperature of from 300 to 1,000° C.

3. The method for producing a gallium trichloride gas according to claim 1, wherein in the first step, the reaction of the metallic gallium and the chlorine gas is carried out at a temperature of from 500 to 1,000° C.

4. The method for producing a gallium trichloride gas according to claim 1, wherein each of the reactions in the first step and the second step is carried out in the presence of a carrier gas in which a molar ratio of a hydrogen gas is $1.0\times10^{-3}$ or less.

5. A method for producing a nitride semiconductor crystal, the method comprising:

producing a gallium trichloride gas by the method for producing a gallium trichloride gas according to claim 1; and growing a nitride semiconductor crystal including gallium on a substrate by a vapor-phase growth method using at least the gallium trichloride gas and an ammonia gas as a raw material gas.

6. The method for producing a nitride semiconductor crystal according to claim 5, wherein in the first step, the reaction of the metallic gallium and the chlorine gas is carried out at a temperature of from 300 to 1,000° C.

7. The method for producing a nitride semiconductor crystal according to claim 5, wherein in the first step, the reaction of the metallic gallium and the chlorine gas is carried out at a temperature of from 500 to 1,000° C.

8. The method for producing a nitride semiconductor crystal according to claim 5, wherein each of the reactions in the first step and the second step is carried out in the presence of a carrier gas in which a molar ratio of a hydrogen gas is $1.0\times10^{-3}$ or less.

9. The method of claim 1, wherein the method comprises performing the first and second step in a reaction tube comprising a first zone and a second zone, wherein the first step is performed in the first zone and the second step is performed in the second zone.

10. The method of claim 5, wherein the producing the gallium trichloride gas comprises performing the first and second step in a reaction tube comprising a first zone and a second zone, wherein the first step is performed in the first zone and the second step is performed in the second zone.

11. The method for producing a gallium trichloride gas according to claim 1, wherein in the second step, the reaction of the gallium monochloride gas and the chlorine gas is carried out at a temperature of from 750 to 1,000° C.

12. The method for producing a nitride semiconductor crystal according to claim 5, wherein in the second step, the reaction of the gallium monochloride gas and the chlorine gas is carried out at a temperature of from 750 to 1,000° C.

* * * * *